(12) United States Patent
Sunagawa et al.

(10) Patent No.: US 11,220,632 B2
(45) Date of Patent: Jan. 11, 2022

(54) CERAMIC COMPLEX, LIGHT SOURCE FOR PROJECTOR, AND METHOD FOR PRODUCING CERAMIC COMPLEX

(71) Applicant: NICHIA CORPORATION, Anan (JP)

(72) Inventors: Seigo Sunagawa, Anan (JP); Shozo Taketomi, Tokushima (JP); Yasuaki Mashima, Tokushima (JP); Takafumi Sumie, Anan (JP)

(73) Assignee: NICHIA CORPORATION, Anan (JP)

(*) Notice: Subject to any disclaimer, the term of this patent is extended or adjusted under 35 U.S.C. 154(b) by 296 days.

(21) Appl. No.: 16/374,244

(22) Filed: Apr. 3, 2019

(65) Prior Publication Data

US 2019/0309223 A1 Oct. 10, 2019

(30) Foreign Application Priority Data

Apr. 5, 2018 (JP) .............................. JP2018-073505
Jul. 25, 2018 (JP) .............................. JP2018-139052

(51) Int. Cl.
*C09K 11/77* (2006.01)
*C04B 35/117* (2006.01)
(Continued)

(52) U.S. Cl.
CPC ........ *C09K 11/7774* (2013.01); *C04B 35/115* (2013.01); *C04B 35/117* (2013.01);
(Continued)

(58) Field of Classification Search
CPC ... C09K 11/7774; C09K 11/02; C04B 35/115; C04B 35/117; C04B 35/44; C04B 35/64;
(Continued)

(56) References Cited

U.S. PATENT DOCUMENTS 9,605,201 B2 3/2017 Yamaguchi
9,868,270 B2 * 1/2018 Irie .......................... B32B 18/00
(Continued)

FOREIGN PATENT DOCUMENTS

JP 2014234487 A 12/2014
JP 2015149394 A 8/2015
(Continued)

OTHER PUBLICATIONS

Cozzan, C., et al. "Stable, Heat-Conducting Phospor Composites for High-Power Laser Lighting", (Feb. 5, 2018), vol. 10, No. 6, Applied Materials & Interfaces, p. 5673-5681, 10 pages.
(Continued)

*Primary Examiner* — C Melissa Koslow
(74) *Attorney, Agent, or Firm* — Hunton Andrews Kurth LLP

(57) ABSTRACT

Provided are a ceramic complex capable of improving the luminous efficiency, a projector comprising a ceramic complex, and a method for producing a ceramic complex. Proposed is a ceramic complex including a rare earth aluminate fluorescent material having an average particle diameter in a range of 15 μm or more and 40 μm or less, aluminum oxide having a purity of aluminum oxide of 99.0% by mass or more, and voids, wherein the content of the rare earth aluminate fluorescent material is in a range of 15% by mass or more and 50% by mass or less relative to a total amount of the rare earth aluminate fluorescent material and the aluminum oxide, and a void fraction is in a range of 1% or more and 10% or less.

14 Claims, 4 Drawing Sheets

(51) Int. Cl.
*C04B 35/64* (2006.01)
*C09K 11/02* (2006.01)
*G03B 21/20* (2006.01)
*C04B 35/44* (2006.01)
*C04B 35/115* (2006.01)
*H05B 33/14* (2006.01)
*C04B 38/00* (2006.01)
*C04B 111/80* (2006.01)
*H01S 5/00* (2006.01)

(52) U.S. Cl.
CPC .............. *C04B 35/44* (2013.01); *C04B 35/64* (2013.01); *C04B 38/0074* (2013.01); *C09K 11/02* (2013.01); *G03B 21/204* (2013.01); *H05B 33/14* (2013.01); *C04B 2111/807* (2013.01); *C04B 2235/3217* (2013.01); *C04B 2235/3222* (2013.01); *C04B 2235/3224* (2013.01); *C04B 2235/3225* (2013.01); *C04B 2235/3229* (2013.01); *C04B 2235/3286* (2013.01); *C04B 2235/5436* (2013.01); *C04B 2235/5445* (2013.01); *C04B 2235/656* (2013.01); *C04B 2235/662* (2013.01); *C04B 2235/664* (2013.01); *C04B 2235/764* (2013.01); *C04B 2235/77* (2013.01); *C04B 2235/786* (2013.01); *C04B 2235/80* (2013.01); *C04B 2235/963* (2013.01); *C04B 2235/9653* (2013.01); *H01S 5/00* (2013.01)

(58) Field of Classification Search
CPC ........... C04B 38/0074; C04B 2111/807; C04B 2111/2235; C04B 2111/056; C04B 2111/662; C04B 2111/77; C04B 2111/764; C04B 2111/78; C04B 2111/80; C04B 2111/963; C04B 2111/9653; G03B 21/204

See application file for complete search history.

(56) References Cited

U.S. PATENT DOCUMENTS

| | | |
|---|---|---|
| 2012/0045634 A1 | 2/2012 | Irie et al. |
| 2015/0219291 A1 | 8/2015 | Yamaguchi |
| 2020/0392401 A1* | 12/2020 | Ito ..................... C09K 11/7774 |

FOREIGN PATENT DOCUMENTS

| | | | |
|---|---|---|---|
| JP | 2016-204563 | * | 12/2016 |
| JP | 2016204563 A | | 12/2016 |
| WO | 2006097876 A1 | | 9/2006 |
| WO | WO 2018/154869 | * | 8/2018 |

OTHER PUBLICATIONS

Li, S., et al. "$Al_2O_3$—YAG:Ce composite phosphor ceramic: a thermally robust and efficient color converter for solid state laser lighting", (Oct. 2019), vol. 4, No. 37, Journal of Materials Chemistry C, p. 8648-8654, 8 pages.

* cited by examiner

CERAMIC COMPLEX, LIGHT SOURCE FOR PROJECTOR, AND METHOD FOR PRODUCING CERAMIC COMPLEX

CROSS-REFERENCE TO RELATED PATENT APPLICATION

This application claims priority to Japanese Patent Application No. 2018-073505, filed on Apr. 5, 2018, and Japanese Patent Application No. 2018-139052, filed on Jul. 25, 2018, the entire disclosures of which are incorporated herein by references in their entirety.

BACKGROUND

Technical Field

The present invention relates to a ceramic complex that converts a wavelength of light emitted from a light emitting diode (hereinafter also referred to as "LED") or a laser diode (hereinafter also referred to as "LD"), a projector, and a method for producing a ceramic complex. In this specification, the "fluorescent material" is used in the same meaning as a "fluorescent phosphor".

Description of Related Art

A ceramic complex containing a fluorescent material that converts a wavelength of light emitted from an LED or LD light emitting element is used as a wavelength conversion member which is, for example, useful for on-board, ordinary lighting, backlight of liquid crystal display device, projector, and so on.

Examples of the fluorescent material that converts light from a light emitting element include rare earth aluminate fluorescent materials containing a rare earth element, such as yttrium and lutetium. As a wavelength conversion member containing such a fluorescent material, for example. Japanese Unexamined Patent Publication No. 2014-234487 discloses a sintered body obtained by mixing an inorganic material powder and an inorganic fluorescent material powder and melting the inorganic material powder, followed by solidification.

However, the sintered body disclosed in PTL 1 is not satisfactory in luminous efficiency.

Thus, an embodiment of the present disclosure is aimed to provide a ceramic complex with high luminous efficiency, a light source for projector, and a method for producing a ceramic complex.

SUMMARY

Solutions to the foregoing problem are as follows, and the present disclosure includes the following embodiments.

A first aspect of the present disclosure is concerned with a ceramic complex including a rare earth aluminate fluorescent material having an average particle diameter in a range of 15 µm or more and 40 µm or less, aluminum oxide having a purity of aluminum oxide of 99.0% by mass or more, and voids, wherein the content of the rare earth aluminate fluorescent material is in a range of 15% by mass or more and 50% by mass or less relative to a total amount of the rare earth aluminate fluorescent material and the aluminum oxide, and a void fraction is in a range of 1% or more and 10% or less.

A second embodiment of the present disclosure is concerned with a light source for projector including the above-described ceramic complex and a light source.

A third embodiment of the present disclosure is concerned with a method for producing a ceramic complex, including preparing a molded body containing a rare earth aluminate fluorescent material having an average particle diameter in a range of 15 µm or more and 40 µm or less and aluminum oxide particles having an average particle diameter in a range of 0.2 µm or more and 1.7 µm or less and a purity of aluminum oxide of 99.0% by mass or more; and calcining the molded body in an atmospheric atmosphere to obtain a ceramic complex having a void fraction in a range of 1% or more and 10% or less.

In accordance with embodiments of the present disclosure, they are possible to provide a ceramic complex with high luminous efficiency, a light source for projector, and a method for producing a ceramic complex.

DETAILED DESCRIPTION

Figure 1:
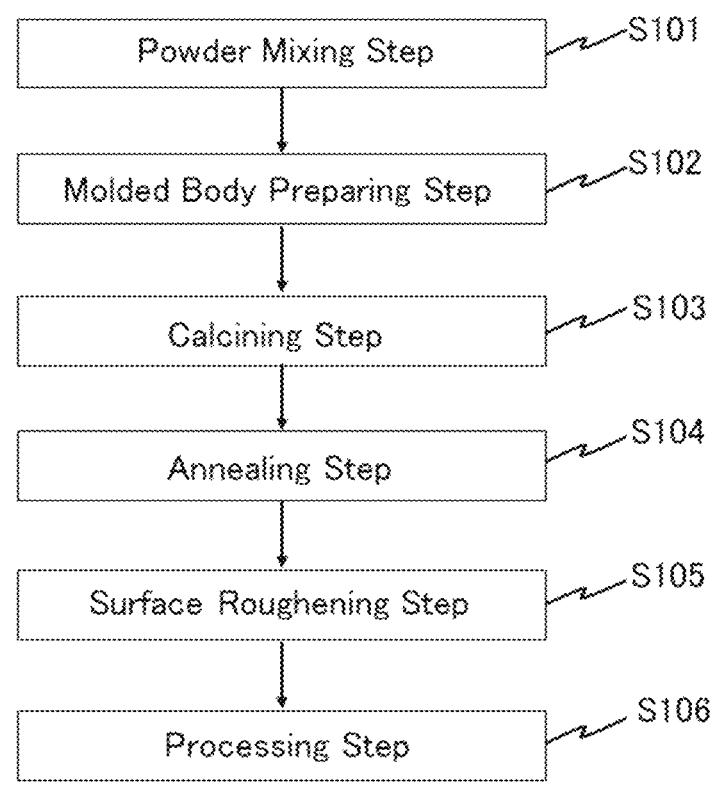
FIG. 1 is a flow chart showing a step order of a method for producing a ceramic complex of a third embodiment of the present disclosure.

The ceramic complex, the light source for projector, and the method for producing a ceramic complex according to the present invention are hereunder described on the basis of embodiments. However, the embodiments as shown below are exemplifications for embodying the technical concept of the present invention, and the present invention is not limited to the following ceramic complex, projector, and method for producing a ceramic complex. The relationship between the color name and the chromaticity coordinate, the relationship between the wavelength range of light and the color name of monochromic light, and so on are in accordance with JIS Z8110.

Ceramic Complex

The ceramic complex according to a first embodiment of the present disclosure includes a rare earth aluminate fluorescent material having an average particle diameter in a range of 15 µm or more and 40 µm or less, aluminum oxide having a purity of aluminum oxide of 99.0% by mass or more, and voids, wherein the content of the rare earth aluminate fluorescent material is in a range of 15% by mass or more and 50% by mass or less relative to a total amount of the rare earth aluminate fluorescent material and the aluminum oxide, and a void fraction is in a range of 1% or more and 10% or less. In this specification, the void fraction of the ceramic complex refers to a value obtained by subtracting a relative density of the ceramic complex in the case of defining a true density of the ceramic complex as 100%, as described later. In the ceramic complex, in the case where the void fraction is in a range of 1% or more and 10% or less, the relative density is 90% or more and 99% or less. In this specification, the void refers to a space existing in the ceramic complex. The ceramic complex according to the first embodiment of the present disclosure is high in efficiency for subjecting incident light on the ceramic complex to wavelength conversion and has high luminous efficiency, and can be used for a wavelength conversion member.

As for the ceramic complex, in a matrix composed of aluminum oxide, the rare earth aluminate fluorescent material which is discriminated from the aluminum oxide constituting this matrix (hereinafter also referred to as "base material") by a grain boundary exists. The ceramic complex is constituted through integration of aluminum oxide with the rare earth aluminate fluorescent material. The ceramic complex contains a rare earth aluminate fluorescent material having an average particle diameter in a range of 15 µm or more and 40 µm or less and aluminum oxide having a high purity as 99.0% by mass or more, and therefore, the efficiency for subjecting incident light on the ceramic complex to wavelength conversion becomes high due to the rare earth aluminate fluorescent material having a relatively large average particle diameter, so that the luminous efficiency can be enhanced.

The ceramic complex has a void fraction in a range of 1% or more and 10% or less. When the void fraction of the ceramic complex is in a range of 1% or more and 10% or less, the incident light on the ceramic complex and the light subjected to wavelength conversion by the fluorescent material can be diffusely reflected by the voids contained in the ceramic complex and scattered, and therefore, the luminous efficiency can be enhanced. The void fraction of the ceramic complex is preferably in a range of 2% or more and 9% or less, and more preferably in a range of 3% or more and 8% or less.

The ceramic complex has a relative density in a range of 90% or more and 99% or less, preferably in a range of 91% or more and 98% or less, and more preferably in a range of 92% or more and 97% or less. When the relative density of the ceramic complex is 90% or more, the void fraction is 10% or less, and therefore, a proportion at which the incident light transmits without being subjected to wavelength conversion becomes small, so that the efficiency for subjecting the incident light to wavelength conversion can be enhanced. In addition, since the relative density of the ceramic complex is high as 90% or more, the transmittance of the aluminum oxide becomes high, the luminous efficiency is high, and desired mixed color light can be obtained. When the relative density of the ceramic complex is 99% or less, the void fraction is 1% or more, and therefore, the incident light on the ceramic complex can be diffusely reflected and light-scattered by the voids contained in the ceramic complex, and the luminous efficiency can be improved.

Relative Density of Ceramic Complex

In this specification, the relative density of the ceramic complex refers to a value calculated by an apparent density of the ceramic complex relative to a true density of the ceramic complex. The relative density is calculated according to the following equation (1).

$$\text{Relative density (\%) of ceramic complex} = [(\text{Apparent density of ceramic complex}) \div (\text{True density of ceramic complex})] \times 100 \quad (1)$$

When a mass proportion (% by mass) of the rare earth aluminate fluorescent material contained in the ceramic complex is designated as $P_m$, a density (g/cm³) of the rare earth aluminate fluorescent material as $P_d$, a mass proportion (% by mass) of the aluminum oxide contained in the ceramic complex as $A_m$, and a density (g/cm³) of the aluminum oxide as $A_d$, respectively, the true density of the ceramic complex is calculated according to the following equation (2).

$$\text{True density of ceramic complex} = \frac{P_d \times A_d \times 100}{(A_d \times P_m) + (P_d \times A_m)} \quad (2)$$

$P_m$: Mass proportion (% by mass) of rare earth aluminate fluorescent material $P_d$: True density (g/cm³) of rare earth aluminate fluorescent material $A_m$: Mass proportion (% by mass) of aluminum oxide $A_d$: True density (g/cm³) of aluminum oxide $P_m + A_m = 100\%$ by mass The apparent density of the ceramic complex refers to a value obtained by dividing the mass (g) of the ceramic complex by a volume (cm³) of the ceramic complex determined by the Archimedes method. The apparent density of the ceramic complex is calculated according to the following equation (3).

$$\text{Apparent density of ceramic complex} = [\text{Mass (g) of ceramic complex}] \div [\text{Volume(cm}^3\text{) of ceramic complex (Archimedes method)}] \quad (3)$$

Void Fraction of Ceramic Complex

In this specification, the void fraction of the ceramic complex refers to a value obtained by subtracting from 100% the relative density of the ceramic complex in the case of defining the true density of the ceramic complex as 100%. Specifically, the void fraction can be calculated according to the following equation (4).

$$\text{Void fraction (\%) of ceramic complex} = 100\% - [\text{Relative density (\%) of ceramic complex}] \quad (4)$$

As for the size of the voids contained in the ceramic complex, it is preferred that a maximum pore diameter of the voids measured on observing a cross section of the ceramic complex with a scanning electron microscope (SEM) is in a range of 1 µm or more and 15 µm or less. When the maximum pore diameter of the voids contained in the ceramic complex is 1 µm or more and 15 µm or less, the incident light can be diffusely reflected and scattered by voids contained in the ceramic complex without being transmitted as it is, and the luminous efficiency can be improved. The maximum pore diameter of the voids contained in the ceramic complex is more preferably in a range of 1 µm or more and 10 µm or less.

The ceramic complex has a first principal surface serving as an incident surface of light and a second principal surface serving as an outgoing surface of light, which is positioned on the opposite side to the first principal surface, and a plate thickness of a plate-like body is preferably in a range of 90 µm or more and 250 µm or less. The ceramic complex is preferably a plate-like body. The plate thickness of the ceramic complex is more preferably in a range of 95 µm or more and 200 µm or less, and still more preferably in a range of 100 µm or more and 180 µm or less. When the ceramic complex is a plate-like body, and its plate thickness is in a range of 90 µm or more and 250 µm or less, the incident light on the ceramic complex is efficiently subjected to wavelength conversion, so that the luminous efficiency can be enhanced. In addition, the ceramic complex that is the plate-like body having a plate thickness in a range of 90 µm or more and 250 µm or less diffusely reflects and scatters the incident light and the light subjected to wavelength conversion by the voids contained in the ceramic complex, so that the luminous efficiency can be enhanced.

In the ceramic complex, an arithmetic average roughness Sa of the surface on the second principal surface serving as the outgoing surface of light is preferably in a range of 0.05 µm or more and 15 µm or less. When the arithmetic average roughness Sa of the surface on the second principal surface of the ceramic complex is in a range of 0.05 µm or more and 15 µm or less, it is expressed that the second principal surface is a relatively rough surface. When the second principal surface of the ceramic complex is a relatively rough surface, the light emitted from the ceramic complex is multiply-reflected by the rough surface having an angle against the flat surface, light of a straight pathway which is closer to the vertical direction relative to the outgoing surface can be emitted, and the outgoing light can be condensed into a desired position. In the ceramic complex, the arithmetic average roughness Sa of the surface on the second principal surface is more preferably in a range of 0.06 µm or more and 12 µm or less, still more preferably in a range of 0.07 µm or more and 10 µm or less, and yet still more preferably in a range of 0.08 µm or more and 5 µm or less. In the second principal surface serving as the outgoing surface of the ceramic complex, for example, when the arithmetic average roughness Sa of the surface is less than 0.05 µm, it is expressed that the second principal surface is in a flatter state. When the second principal surface of the ceramic complex is in a flatter state, the light emitted from the ceramic complex is scattered without being multiply-reflected on the outgoing surface, and therefore, there is a case where it becomes difficult to condense the light emitted from the ceramic complex. The arithmetic average roughness Sa of the surface is a parameter resulting from expanding an arithmetic average roughness Ra of a line. The arithmetic average roughness Sa of the surface on the second principal surface or first principal surface of the ceramic complex can be measured by a roughness shape measuring instrument (a product name: VS1550, manufactured by Hitachi, Ltd.) in conformity with ISO 25178.

In the ceramic complex, it is preferred that the arithmetic average roughness Ra of the line on the second principal surface serving as the outgoing surface of light is in a range of 0.1 µm or more and 20 µm or less. When the arithmetic average roughness Ra of the line on the second principal surface of the ceramic complex is in a range of 0.1 µm or more and 20 µm or less, it is expressed that the second principal surface is a relatively rough surface, the light emitted from the second principal surface is multiply-reflected by the rough surface having an angle against the flat surface, light of a straight pathway which is closer to the vertical direction relative to the outgoing surface can be emitted, and the outgoing light can be condensed into a desired position. In the ceramic complex, the arithmetic average roughness Ra of the line on the second principal surface is more preferably in a range of 0.5 µm or more and 15 µm or less, still more preferably in a range of 0.8 µm or more and 12 µm or less, and yet still more preferably in a range of 1.0 µm or more and 10 µm or less. In the second principal surface serving as the outgoing surface of the ceramic complex, for example, when the arithmetic average roughness Ra of the line is less than 0.1 µm, it is expressed that the second principal surface is in a flatter state, and the light emitted from the second principal surface is scattered without being multiply-reflected on the outgoing surface, and therefore, there is a case where it becomes difficult to condense the light. The arithmetic average roughness Ra of the line on the second principal surface or first principal surface of the ceramic complex can be measured by a roughness shape measuring instrument (a product name: SJ-210, manufactured by Mitutoyo Corporation) in conformity with ISO 1997.

In the ceramic complex, taking into consideration easiness of incidence of light, the arithmetic average roughness Sa of the surface on the first principal surface serving as the incident surface of light is preferably in a range of 0.0005 µm or more and 10 µm or less. In the ceramic complex, taking into consideration easiness of incidence of light, the arithmetic average roughness Ra of the line on the first principal surface is preferably in a range of 0.001 µm or more and 15 µm or less. In the ceramic complex, it is preferred that the arithmetic average roughness Sa of the surface and the arithmetic average roughness Ra of the line on the first principal surface serving as the incident surface of light, and the arithmetic average roughness Sa of the surface and the arithmetic average roughness Ra of the line on the second principal surface serving as the outgoing surface of light are different from each other. It is preferred that the arithmetic average roughness Sa of the surface on the second principal surface is larger than the arithmetic average roughness Sa of the surface on the first principal surface. It is preferred that the arithmetic average roughness Ra of the line on the second principal surface is larger than the arithmetic average roughness Ra of the line on the first principal surface.

In the ceramic complex, the ratio of the light diameter of the outgoing light emitted from the second principal surface to the light diameter of the incident light to be allowed to enter the first main surface [(light diameter of outgoing light)/(light diameter of incident light)] is preferably in a range of 0.40 or more and 0.90 or less, more preferably in a range of 0.45 or more and 0.85 or less, still more preferably in a range of 0.50 or more and 0.80 or less, yet still more preferably in a range of 0.55 or more and 0.75 or less, and especially preferably in a range of 0.60 or more and 0.70 or less. When the ratio of the light diameter of the outgoing light emitted from the second principal surface to the light diameter of the incident light to be allowed to enter the first main surface of the ceramic complex [hereinafter also referred to as "light diameter ratio (outgoing light)/(incident light)"] is in a range of 0.40 or more and 0.90 or less, the diffusion of the light emitted from the ceramic complex is suppressed, so that the light emitted from the ceramic complex can be condensed into a desired position. The light diameter of the incident light to be allowed to enter the first principal surface of the ceramic complex is the light diameter of the light emitted from a light source. The light diameter of the incident light to be allowed to enter the first principal surface of the ceramic complex can be, for example measured with a color and luminance meter. The light diameter of the incident light is preferably in a range of 1 mm or more and 5 mm or less, and more preferably in a range of 2 mm or more and 4 mm or less. As for the light diameter of the outgoing light emitted from the second principal surface of the ceramic complex, the light emission luminance of the light emitted from the ceramic complex was measured with a color and luminance meter; when a position exhibiting a maximum luminance in the obtained light emission spectrum was defined as a center (measuring center), and distances (mm) of two positions where a luminance became one-hundredth of the maximum luminance in the light emission spectrum (such luminance will be also referred to as "one-hundredth luminance") from the measuring center were each measured as an absolute value; and the sum of the absolute values of the distances (mm) of the two positions where the luminance became one-hundredth of the maximum luminance in the light emission spectrum from the measuring center was measured as the light diameter of the outgoing light emitted from the second principal surface.

The wavelength conversion member may contain, in addition to the ceramic complex, a light transmission body for protecting the ceramic complex, and may also contain an adhesive layer for adhering the ceramic complex and the light transmission body to each other.

Rare Earth Aluminate Fluorescent Material

The rare earth aluminate fluorescent material contained in the ceramic complex has an average particle diameter in a range of 15 µm or more and 40 µm or less, preferably in a range of 20 µm or more and 38 µm or less, and still more preferably in a range of 21 µm or more and 35 µm or less. When the average particle diameter of the rare earth aluminate fluorescent material contained in the ceramic complex is less than 15 µm, the wavelength conversion efficiency of the light allowed to enter the ceramic complex is lower, so that there is a case where it becomes difficult to enhance the luminous efficiency. In addition, when the average particle diameter of the rare earth aluminate fluorescent material contained in the ceramic complex is less than 15 µm, in view of the fact that the average particle diameter becomes small, the fluorescent material and the aluminum oxide constituting the base material of the ceramic complex densely come close to each other, so that it becomes difficult to obtain a ceramic complex having a void fraction in a range of 1% or more and 10% or less. When the average particle diameter of the rare earth aluminate fluorescent material is more than 40 µm, the particle diameter of the fluorescent material is excessively large, so that there is a case where it becomes difficult to uniformly dispose the fluorescent material in the ceramic complex. The average particle diameter of the rare earth aluminate fluorescent material can be measured by the Fisher sub-sieve sizer method (hereinafter also referred to as "FSSS method"). The average particle diameter measured by the FSSS method is also referred to as "Fisher sub-sieve sizer's No.". The FSSS method is a method of measuring a specific surface area utilizing circulation resistance of air, to determine the particle diameter by means of the air permeability method.

The content of the rare earth aluminate fluorescent material in the ceramic complex is in a range of 15% by mass or more and 50% by mass or less, preferably in a range of 20% by mass or more and 50% by mass or less, more preferably in a range of 22% by mass or more and 48% by mass or less, and still more preferably in a range of 23% by mass or more and 45% by mass or less. When the content of the rare earth aluminate fluorescent material in the ceramic complex is less than 15% by mass, the amount of the fluorescent material is small, so that there is a case where the efficiency for subjecting the ceramic complex to wavelength conversion is reduced, and the luminous efficiency is reduced. When the content of the rare earth aluminate fluorescent material in the ceramic complex is more than 50% by mass, the amount of the aluminum oxide becomes relatively small, and it becomes difficult to obtain a ceramic complex having a void fraction in a range of 1% or more and 10% or less, so that there is a case where the luminous efficiency of the obtained ceramic complex is decreased. In addition, when the content of the rare earth aluminate fluorescent material in the ceramic complex is more than 50% by mass, the amount of the aluminum oxide constituting the base material of the ceramic complex becomes relatively small, and therefore, there is a case where the strength of the ceramic complex is worsened. In the case where a total amount of the rare earth aluminate fluorescent material and the aluminum oxide particles is defined as 100% by mass, a mass proportion (% by mass) of the rare earth aluminate fluorescent material in the ceramic complex is identical with a blending proportion (% by mass) of the rare earth aluminum fluorescent material in a mixed powder of a mixture of the rare earth aluminate fluorescent material and the aluminum oxide particles.

It is preferred that the rare earth aluminate fluorescent material contains a composition represented by the following formula (I).

$$(Ln_{1-a}Ce_a)_3(Al_cGa_b)_5O_{12} \qquad (I)$$

In the formula (I), Ln is at least one rare earth element selected from the group consisting of Y, Gd, Lu, and Tb; and a, b, and c each satisfy $0<a\leq0.022$, $0\leq b\leq0.4$, $0<c\leq1.1$, and $0.9\leq(b+c)\leq1.1$. In this regard, the parameters a, b, and c in the formula (I) are each determined when the total sum of the molar ratio of Ln and the molar ratio of Ce is 3 based on analysis values. The term 'molar ratio' refers to the molar amount of an element in one mole of the composition of the fluorescent material.

In the composition represented by the formula (I), Ln is at least one rare earth element selected from the group consisting of Y, Gd, Lu, and Tb, and two or more rare earth elements may be contained. Ce is an activation element of the fluorescent material, and the product of the parameter a and 3 represents the molar ratio of Ce in the composition represented by the formula (I). The parameter a is in a range of more preferably 0.00005 or more and 0.021 or less ($0.005\times10^{-2}\leq a\leq0.021$), and still more preferably in a range of 0.0001 or more and 0.020 or less ($0.01\times10^{-2}\leq a\leq0.020$). In the composition represented by the formula (I), the product of the parameter b and 5 represents the molar ratio of Ga. In the composition represented by the formula (I), in order to undergo wavelength conversion into a desired color tone, the parameter b may be in a range of 0.00001 or more and 0.35 or less ($0.001\times10^{-2}\leq b\leq0.35$), and may also be in a range of 0.00005 or more and 0.30 or less ($0.005\times10^{-2}\leq b\leq0.30$). In the composition represented by the formula (I), the product of the parameter c and 5 represents the molar ratio of Al. The parameter c is preferably in a range of more than 0 and 1.1 or less ($0<c\leq1.1$), and more preferably in a range of 0.5 or more and 1.0 or less ($0.5\leq c\leq1.0$). In order to undergo wavelength conversion into a desired color tone, the sum total of the parameter b and the parameter c is preferably in a range of 0.9 or more and 1.1 or less ($0.9\leq(b+c)\leq1.1$), and more preferably in a range of 0.95 or more and 1.0 or less ($0.95\leq(b+c)\leq1.0$).

Aluminum Oxide

The ceramic complex contains aluminum oxide having a purity of aluminum oxide of 99.0% by mass or more. As for the aluminum oxide constituting the base material of the ceramic complex, the surfaces of the aluminum oxide particles serving as the raw material are melted, and the aluminum oxide particles are fused with each other in a state where a grain boundary of the aluminum oxide particles can be confirmed through observation with a scanning electron microscope (SEM), whereby the base material of the ceramic complex is constituted.

In the aluminum oxide contained in the ceramic complex, the purity of aluminum oxide is 99.0% by mass or more, and preferably, the purity of aluminum oxide is 99.5% by mass or more. When the base material of the ceramic complex is constituted of the aluminum oxide having a purity of aluminum oxide of 99.0% by mass or more, the transparency of the base material is high, the incident light transmits through the aluminum oxide serving as the base material, and the efficiency for subjecting the light to wavelength conversion with the rare earth aluminate fluorescent material becomes high, so that the luminous efficiency can be enhanced. In addition, in the ceramic complex, the base material is constituted of aluminum oxide with a high thermal conductivity, and therefore, the thermal conductivity of the ceramic complex becomes favorable. For example, in the case of using an LED or LD light emitting element as a light source, when the ceramic complex is used as a wavelength conversion member, the heat which has increased by the light allowed to enter from the light emitting element is efficiently released, so that decreasing of luminous efficiency of the fluorescent material contained in the ceramic complex can be suppressed. In particular, in the case of using LD as a light source, the light density of the light emitted from LD is very high, and therefore, the temperature of the ceramic complex which the light emitted from LD has entered increases, and the fluorescent material contained in the ceramic complex is liable to be deteriorated due to the temperature. Since the ceramic complex made of aluminum oxide as the base material has a high thermal conductivity, even when the light is allowed to enter from LD, the heat can be efficiently dissipated, and the deterioration of the fluorescent material due to an increase of the temperature can be inhibited. When the purity of the aluminum oxide constituting the base material of the ceramic complex is less than 99.0% by mass, the light transmittance of the base material is decreased, so that there is a case where the luminous efficiency of the ceramic complex is decreased.

As for the purity of the aluminum oxide, the purity of aluminum oxide of the aluminum oxide particles serving as the raw material of the ceramic complex can be measured by a method as described later. In addition, it is also possible to measure the purity of the aluminum oxide by taking out aluminum oxide constituting the base material of the ceramic complex and performing the measurement in the same method as in the measurement of the purity of aluminum oxide of the aluminum oxide particles.

The content of the aluminum oxide in the ceramic complex is preferably in a range of 50% by mass or more and 85% by mass or less, more preferably in a range of 50% by mass or more and 80% by mass or less, still more preferably in a range of 52% by mass or more and 78% by mass or less, and yet still more preferably in a range of 55% by mass or more and 77% by mass or less based on 100% by mass of a total amount of the rare earth aluminate fluorescent material and the aluminum oxide. When the content of the aluminum oxide in the ceramic complex is less than 50% by mass, it becomes difficult to obtain a ceramic complex having a void fraction of in a range of 1% or more and 10% or less, and the amount of the aluminum oxide constituting the base material of the ceramic complex becomes small, and therefore, the strength of the ceramic complex is worsened. When the content of the aluminum oxide in the ceramic complex is more than 85% by mass, the content of the rare earth aluminate fluorescent material becomes relatively small, so that there is a case where the luminous efficiency of the ceramic complex is worsened. In the case where a total amount of the rare earth aluminate fluorescent material and the aluminum oxide particles is defined as 100% by mass, the content (% by mass) of the aluminum oxide in the ceramic complex is identical with a blending proportion (% by mass) of the aluminum oxide particles in a mixed powder of a mixture of the rare earth aluminate fluorescent material and the aluminum oxide particles.

Production Method of Ceramic Complex

The production method of a ceramic complex according to a third embodiment of the present disclosure includes preparing a molded body containing a rare earth aluminate fluorescent material having an average particle diameter in a range of 15 μm or more and 40 μm or less and aluminum oxide particles having an average particle diameter in a range of 0.2 μm or more and 1.7 μm or less and a purity of aluminum oxide of 99.0% by mass or more; and calcining the molded body in an atmospheric atmosphere to obtain a ceramic complex having a void fraction in a range of 1% or more and 10% or less.

In the production method of a ceramic complex according to the third embodiment of the present disclosure, as for the rare earth aluminate fluorescent material contained in the molded body, the same material as in the rare earth aluminate fluorescent material contained in the ceramic complex can be used. In the production method of a ceramic complex according to the third embodiment, it is preferred that the rare earth aluminate fluorescent material contained in the molded body contains the composition represented by the formula (I).

In the production method of a ceramic complex according to the third embodiment of the present disclosure, as for the aluminum oxide particles contained in the molded body, those having the same purity as in the aluminum oxide contained in the ceramic complex can be used. The average particle diameter of the aluminum oxide particles is in a range of 0.2 μm or more and 1.7 μm or less, preferably in a range of 0.3 μm or more and 1.6 μm or less, and more preferably in a range of 0.4 μm or more and 1.5 μm or less. When the average particle diameter of the aluminum oxide particles is in a range of 0.2 μm or more and 1.7 μm or less, the powder of the rare earth aluminate fluorescent material and the aluminum oxide particles can be uniformly mixed with each other. When the rare earth aluminate fluorescent material and the aluminum oxide particles can be uniformly mixed with each other, in the subsequent calcining step, the aluminum oxide particles are melted from the surfaces thereof, the surfaces of the particles are fused with each other, and the density of the whole becomes uniform, whereby a matrix of the ceramic complex in which voids having a void fraction in a range of 1% or more and 10% or less are uniformly formed is constituted. When the average particle diameter of the aluminum oxide particles is less than 0.2 μm, there is a concern that the aluminum oxide particles having a small particle diameter are densely fused with each other at the time of the calcining, and mixing becomes non-uniform, and it becomes difficult to form a ceramic complex having a void fraction in a range of 1% or more and 10% or less. In addition, when the average particle diameter of the aluminum oxide particles is more than 1.7 μm, the particle diameter becomes excessively large, and a lot of voids having a void fraction of more than 10% are contained in the ceramic complex, so that there is a case where the luminous efficiency of the ceramic complex is decreased. In this specification, the average particle diameter of the aluminum oxide particles refers to an average particle diameter measured by the FSSS method.

As for the purity of the aluminum oxide of the aluminum oxide particles, in the case of using commercially available aluminum oxide particles, values of the purity of aluminum oxide described in catalogs can be made by reference. In the case where the purity of aluminum oxide of the aluminum oxide particles is unclear, after measuring a mass of the aluminum oxide particles, the aluminum oxide particles are baked in an atmospheric atmosphere at 800° C. for 1 hour, thereby removing the moisture which organic materials attached to the aluminum oxide particles or the aluminum oxide particles absorb. Subsequently, by measuring a mass of the aluminum oxide particles after baking and then dividing the mass of the aluminum oxide particles after baking by the mass of the aluminum oxide particles before baking, the purity of the aluminum oxide of the aluminum oxide particles can be measured. The purity of the aluminum oxide of the aluminum oxide particles can be, for example, calculated according to the following equation (5).

Purity (% by mass) of aluminum oxide=[(Mass of aluminum oxide particle after calcining)÷(Mass of aluminum oxide particles before calcining)]× 100    (5)

The content of the rare earth aluminate fluorescent material in the molded body is preferably in a range of 15% by mass or more and 50% by mass or less, more preferably in a range of 20% by mass or more and 50% by mass or less, still more preferably in a range of 22% by mass or more and 48% by mass or less, and especially preferably in a range of 23% by mass or more and 45% by mass or less relative to a total amount of the rare earth aluminate fluorescent material and the aluminum oxide particles. When the content of the rare earth aluminate fluorescent material in the molded body is in arrange of 15% by mass or more and 50% by mass or less, a ceramic complex with high wavelength conversion efficiency of light and high luminous efficiency can be obtained. In the case where a total amount of the rare earth aluminate fluorescent material and the aluminum oxide particles is defined as 100% by mass, the content (% by mass) of the rare earth aluminate fluorescent material in the molded body is identical with a blending proportion (% by mass) of the rare earth aluminum fluorescent material in a mixed powder of a mixture of the rare earth aluminate fluorescent material and the aluminum oxide particles before constituting the molded body.

The content of the aluminum oxide particles in the molded body is preferably in a range of 50% by mass or more and 85% by mass or less, more preferably in a range of 50% by mass or more and 80% by mass or less, still more preferably in a range of 52% by mass or more and 78% by mass or less, and yet still more preferably in a range of 55% by mass or more and 77% by mass or less based on 100% by mass of a total amount of the rare earth aluminate fluorescent material and the aluminum oxide particles. When the content of the aluminum oxide particles in the molded body is in a range of 50% by mass or more and 85% by mass or less, a ceramic complex having a void fraction in a range of 1% or more and 10% or less, which is high in strength and favorable in a thermal conductivity, can be obtained. When the content of the aluminum oxide in the molded body is less than 50% by mass, a ceramic complex having a void fraction in a range of 1% or more and 10% or less is hardly formed, and the amount of the aluminum oxide constituting the base material of the obtained ceramic complex becomes small, so that there is a case where the strength of the obtained ceramic complex is decreased. When the content of the aluminum oxide particles in the molded body is more than 85% by mass, the content of the rare earth aluminate fluorescent material becomes relatively small, so that there is a case where the luminous efficiency of the obtained ceramic complex is reduced. In the case where a total amount of the rare earth aluminate fluorescent material and the aluminum oxide particles is defined as 100% by mass, the content (% by mass) of the aluminum oxide particles in the molded body is identical with a blending proportion (% by mass) of the aluminum oxide particles in a mixed powder of a mixture of the rare earth aluminate fluorescent material and the aluminum oxide particles.

The powders constituting the molded body may contain, in addition to the rare earth aluminate fluorescent material and the aluminum oxide particles having a purity of aluminum oxide of 99.0% by mass or more, a powder capable of allowing the incident light to transmit without reducing the efficiency of wavelength conversion of light of the fluorescent material. The powder other than the rare earth aluminate fluorescent material and the aluminum oxide particles each constituting the molded body is preferably a powder of a substance having a relatively high thermal conductivity. By adding a powder of a substance having a relatively high thermal conductivity to the molded body, the heat added to the fluorescent body becomes easy to be released outside the ceramic complex, and heat dissipation of the ceramic complex used as the wavelength conversion member can be improved. Examples of the powder capable of allowing the incident light to transmit and composed of a substance having a relatively high thermal conductivity include at least one powder selected from the group consisting of MgO, LiF, $Nb_2O_5$, NiO, $SiO_2$, $TiO_2$, and $Y_2O_3$. As the powder capable of allowing the incident light to transmit, two or more powders selected from the group consisting of MgO, LiF, $SiO_2$, $TiO_2$, and $Y_2O_3$ may also be used.

In the case where a powder other than the rare earth aluminate fluorescent material and the aluminum oxide particles having a purity of aluminum oxide of 99.0% by mass or more (such a powder will be hereinafter also referred to as "other powder") is contained in the powders constituting the molded body, a total content of the other powder and the aluminum oxide particles is preferably in a range of 50% by mass or more and 85% by mass or less, more preferably in a range of 50% by mass or more and 80% by mass or less, still more preferably in a range of 52% by mass or more and 78% by mass or less, and especially preferably in a range of 55% by mass or more and 77% by mass or less based on 100% by mass of the powders constituting the molded body. The blending ratio of the aluminum oxide particles and the other powder [(aluminum oxide particles)/(powder other than aluminum oxide particles)] on a mass basis is preferably 1/99 to 99/1, and more preferably 10/90 to 90/10.

FIG. 1 is a flow chart showing one example of a step order of the production method of a ceramic complex according to the third embodiment of the present disclosure. Steps of the production method of a ceramic complex are described by reference to FIG. 1. The production method of a ceramic complex includes a molded body preparation step S102 and a calcining step S103 of performing calcining in an atmospheric atmosphere. The production method of a ceramic complex may include a powder mixing step S101 prior to the molded body preparation step S102, and may include an annealing step S104 of heat treating the obtained ceramic complex at the calcining temperature or lower after the calcining step S103. In addition, the production method of a ceramic complex may include a surface roughening step S105 of subjecting the surface of the ceramic complex to surface roughening, after the annealing step S104, and may include a processing step S106 of cutting the ceramic complex into a desired size or thickness. As for the order of the surface roughening step S105 and the processing step S106, the processing step S106 may be performed after the surface roughening step S105, or in a reverse order, the surface roughening step S105 may be performed after the processing step S106.

Powder Mixing Step

In the powder mixing step, the powders constituting the molded body are mixed to obtain a mixed powder. The mixed powder constituting the molded body contains the rare earth aluminate fluorescent material and the aluminum oxide particles having a purity of aluminum oxide of 99.0% by mass or more. As for mixing of the powders, the mixing can be performed using a mortar and a pestle. As for mixing of the powders, the mixing may be performed using a mixing medium, such as a ball mill. In addition, for the purposes of making it easy to mix the powders and further making it easy to mold the mixed powder after mixing, a small amount of a molding aid, such as water and ethanol, may be used. As for the molding aid, one which is readily volatilized in the subsequent calcining step is preferred, and in the case of adding the molding aid, the amount of molding aid is preferably 10% by mass or less, more preferably 8% by mass or less, and still more preferably 5% by mass or less based on 100% by mass of the powders.

Molded Body Preparation Step

In the molded body preparation step, the mixed powder containing the rare earth aluminate fluorescent material and the aluminum oxide particles is molded into a desired shape, to obtain the molded body. As for the molding method of the powders, a known method, such as a press molding method, can be adopted, and examples thereof include a die press molding method and a cold isostatic pressing (CIP) method. As for the molding method, in order to fair the shape of the molded body, two kinds of methods may be adopted, and after performing the die press molding, the CIP may be performed. In the CIP, it is preferred to press the molded body by the cold hydro-isostatic pressing method using water as a medium.

A pressure at the time of the die press molding is preferably 5 MPa to 50 MPa, and more preferably 5 MPa to 30 MPa. When the pressure at the time of the die press molding falls within the above-described range, the molded body can be faired in a desired shape.

A pressure in the CIP treatment is preferably 50 MPa to 200 MPa, and more preferably 50 MPa to 180 MPa. When the pressure in the CIP treatment falls within the above-described range, by bringing the rare earth aluminate fluorescent material particles and the aluminum oxide particles into contact with each other such that a relative density of the ceramic complex obtained after calcining becomes in a range of 90% or more and 99% or less, a molded body from which a ceramic complex containing voids having a void fraction in a range of 1% or more and 10% or less is obtainable can be formed.

Calcining Step

The calcining step is a step of calcining the molded body in an atmospheric atmosphere to obtain a ceramic complex. In the calcining step, by calcining the molded body in an atmospheric atmosphere, a ceramic complex having a void fraction in a range of 1% or more and 10% or less can be obtained. The atmospheric atmosphere is an atmosphere containing oxygen, and the content of oxygen in the atmosphere is not particularly limited. The content of oxygen in the atmosphere is preferably 5% by volume or more, more preferably 10% by volume or more, and still more preferably 15% by volume or more, and it may be an atmospheric (the oxygen content is 20% by volume or more) atmosphere. When the atmosphere is an oxygen-free atmosphere in which the content of oxygen is less than 1% by volume, the surfaces of the aluminum oxide particles are hardly fused, so that there is a case where a ceramic complex having a predetermined void fraction is hardly obtained.

The calcining temperature is preferably in a range of 1,400° C. or higher and 1,800 C or lower, more preferably in a range of 1,500° C. or higher and 1,800° C. or lower, and still more preferably in a range of 1,600° C. or higher and 1,780° C. or lower. When the calcining temperature is 1,400° C. or higher, a ceramic complex having a void fraction in a range of 1% or more and 10% or less can be obtained. In addition, when the calcining temperature is 1,800° C. or lower, for example, the surfaces of the aluminum oxide particles are fused without melting the powders constituting the molded body, to form the base material by the aluminum oxide, and a ceramic complex in which the fluorescent material is contained in the base material of aluminum oxide in a state where a grain boundary can be distinctly confirmed can be obtained. After obtaining the ceramic complex having a void fraction in a range of 1% or more and 10% or less, the obtained ceramic complex may be subjected to a hot isostatic pressing (HIP) treatment. In the case where the HIP treatment step is performed, there is a case where the true density of the ceramic complex becomes high, and in the case where the void fraction of the ceramic complex is less than 1%, the HIP treatment may not be performed.

Annealing Step

It is preferred that the production method of a ceramic complex according to the third embodiment of the present disclosure includes an annealing step of subjecting the obtained ceramic complex to an annealing treatment in a reductive atmosphere to obtain an annealing treated material. By subjecting the ceramic complex to an annealing treatment in a reductive atmosphere, an activation element which has been oxidized in the rare earth aluminate fluorescent material in the air atmosphere is reduced, and reducing of the wavelength conversion efficiency and reducing of the luminous efficiency of the rare earth aluminate fluorescent material can be suppressed. The reductive atmosphere may be an atmosphere containing at least one rare gas selected from the group consisting of helium, neon, and argon, or a nitrogen gas, and a hydrogen gas or a carbon monoxide gas, and it is preferred that at least argon or a nitrogen gas, and a hydrogen gas or a carbon monoxide gas are contained in the atmosphere.

A temperature of the annealing treatment is a temperature lower than the calcining temperature and is preferably in a range of 1,000° C. or higher and 1,600° C. or lower. The temperature of the annealing treatment is more preferably in a range of 1,000° C. or higher and 1,600° C. or lower, and still more preferably in a range of 1,100° C. or higher and 1,400° C. or lower. When the temperature of the annealing treatment is a temperature lower than the calcining temperature and is in a range of 1,000° C. or higher and 1,600° C. or lower, the oxidized activation element contained in the rare earth aluminate fluorescent material in the ceramic complex is reduced without reducing the void fraction of the ceramic complex, so that reducing of the wavelength conversion efficiency and worsening of the luminous efficiency can be suppressed.

Surface Roughening Step

The surface roughening step is a step of subjecting the surface of the obtained ceramic complex or the surface of the annealing treated material of the ceramic complex to surface roughening. The surface roughening step may be performed before a processing step of processing the ceramic complex by cutting in a desired size or thickness, or may be performed after the processing step. The ceramic complex or the annealing treated material of the ceramic complex to be subjected to surface roughening is preferably a plate-like body having a first principal surface serving as an incident surface of light and a second principal surface serving as an outgoing surface of light, which is positioned on the opposite side to the first principal surface, and it is preferred to apply the surface roughening to the second principal surface. Examples of the surface roughening method include a method by sand blast, a method by mechanical grinding, a method by dicing, and a method by chemical etching. It is preferred to perform the surface roughening such that the arithmetic average roughness Sa of the surface on the second principal surface of the ceramic complex or the annealing treated material of the ceramic complex is in a range of 0.05 μm or more and 15 μm or less, and the arithmetic average roughness Ra of the line is in a range of 0.1 μm or more and 20 μm or less.

Processing Step

The processing step is a step of subjecting the obtained ceramic complex or the annealing treated material of the ceramic complex to cutting processing in a desired size or thickness. As the cutting method, a known method can be utilized, and examples thereof include blade dicing, laser dicing, and a method of performing cutting using a wire saw. Among those, a method of performing cutting using a wire saw is preferred from the standpoint that the cut surface becomes flat with high accuracy. According to the processing step, a ceramic complex or an annealing treated material of a ceramic complex having a desired size or thickness can be obtained. It is preferred to perform the cutting processing such that the ceramic complex is formed into a plate-like body having a first principal surface serving as an incident surface of light and a second principal surface serving as an outgoing surface of light, which is positioned on the opposite side to the first principal surface. A plate thickness of the ceramic complex of the plate-like body is preferably in a range of 90 μm or more and 250 μm or less, more preferably in a range of 95 μm or more and 200 μm or less, and still more preferably in a range of 100 μm or more and 180 μm or less. When the ceramic complex is a plate-like body and is subjected to cutting processing such that its plate thickness is in a range of 90 μm or more and 250 μm or less, a ceramic complex or an annealing treated material of a ceramic complex, which is readily processed, is high in luminous efficiency, and is readily handled, can be obtained.

The ceramic complex according to the first embodiment or the ceramic complex obtained by the production method according to the third embodiment can be used, as a light source contains a wavelength conversion member, for a projector or a light emitting device.

Light Source for Projector

The light source for projector according to a second embodiment of the present disclosure contains the ceramic complex according to the first embodiment of the present disclosure or the ceramic complex obtained by the production method according to the third embodiment and a light source. The excitation light source for the projector is preferably a semiconductor laser. In the projector, an excitation light emitted from a semiconductor laser that is the excitation light source is allowed to enter the ceramic complex to be used as the wavelength conversion member, and light of a mixture of a colored beam whose wavelength has been converted by the ceramic complex and a colored beam from the excitation light source is separated into red light, green light, and blue light by plural optical systems, such as a lens array, a deflection conversion element, and a color separation optical system, to undergo modulation according to image information, thereby forming light for color images. The excitation light emitted from the semiconductor laser that is the light source may be allowed to enter the ceramic complex through an optical system, such as a dichromic mirror or collimate optical system.

Light Emitting Device

It is preferred that the light emitting device includes the ceramic complex according to the first embodiment or the ceramic complex obtained by the production method according to the third embodiment and a light emitting element composed of LED chips. When the ceramic complex to be used as the wavelength conversion member is combined with a light emitting element, it becomes possible to constitute a light emitting device for converting the light emitted from the light emitting element and emitting light of a mixture of a colored beam from the light emitting device and a colored beam whose wavelength has been converted by the ceramic complex. As the light emitting element, for example, a light emitting element capable of emitting light in a wavelength range of 350 nm or more and 500 nm can be used. For the light emitting element, for example, a semiconductor light emitting element using a nitride-based semiconductor ($In_XAl_YGa_{1-X-Y}N$, $0 \leq X$, $0 \leq Y$, $(X+Y) \leq 1$) can be used. By using a semiconductor light emitting element as an excitation light source, a stable light emitting device which is high in linearity of an output against an input with high efficiency and strong against a mechanical impact can be obtained.

EXAMPLES

The present invention is hereunder more specifically described by reference to Examples, but it should be construed that the present invention is by no means limited to these Examples.

Production Examples of Rare Earth Aluminate Fluorescent Material

Yttrium oxide ($Y_2O_3$), gadolinium oxide ($Gd_2O_3$), cerium oxide ($CeO_2$), aluminum oxide ($Al_2O_3$), and gallium oxide ($Ga_2O_3$) were weighed, respectively in the composition ratio of each of the Examples and Comparative Examples, to form a raw material mixture, barium fluoride ($BaF_2$) was added as a flux, and the raw material mixture and the flux were mixed in a ball mill. This mixture was put into an alumina crucible and calcined in a reductive atmosphere at a temperature in a range of from 1,400° C. to 1,600° C. for 10 hours, to obtain a calcined product. The obtained calcined product was dispersed in pure water; a solvent stream was allowed to flow while applying various vibrations through a sieve and passed through a wet type sieve; and subsequently, the resultant was dehydrated and dried, and then passed through a dry type sieve to undergo classification, thereby preparing a rare earth aluminate fluorescent material having a composition represented by $(Y_{0.99}Ce_{0.01})_3(Al_{0.98}Ga_{0.01})_5O_{12}$. The composition and average particle diameter of the fluorescent material were measured by the following methods.

Aluminum Oxide Particles

Aluminum oxide particles (purity of aluminum oxide: 99.9% by mass, α-type) having an average particle diameter as measured by the FSSS method as described later of 0.5 μm or 1.1 μm were used. The average particle diameter of the aluminum oxide particles was measured by the FSSS method, and the purity of the aluminum oxide particles was measured by a method as described later.

Average Particle Diameter

With respect to the rare earth aluminate fluorescent material and the aluminum oxide particles used in each of the Examples and Comparative Examples, the average particle diameter by the FSSS method was measured. Specifically, samples of 1 cm³ (fluorescent material and aluminum oxide particles) were weighed, respectively in an environment at a temperature of 25° C. and a humidity of 70% RH by using Fisher Sub-Sieve Sizer Model 95 (manufactured by Fisher Scientific) and packaged in a special-purpose tubular container. Thereafter, dry air at a fixed pressure was allowed to flow, a specific surface area was read from a differential pressure, and the average particle diameter by the FSSS method was calculated. The results are shown in Table 1.

Composition Analysis

With respect to the obtained fluorescent material, a mass percentage (% by mass) of each of elements (Y, Gd, Ce, Al, and Ga) exclusive of oxygen, constituting the rare earth aluminate fluorescent material, was measured with ICP-AES (inductively coupled plasma atomic emission spectrometer) (manufactured by PerkinElmer), and the molar ratio of each element in one mole of the chemical composition of the fluorescent material was calculated from the value of mass percentage of each element. The molar ratios of Al and Ga are values calculated when the sum total of the molar ratio of Y and the molar ratio of Ce based on the measured analysis values is defined as 3, and the molar ratio of 3 of this total molar ratio of Y and Ce is made as a basis.

Measurement of Purity of Aluminum Oxide of Aluminum Oxide Particles

After measuring the mass of the aluminum oxide particles, the aluminum oxide particles were baked in an atmospheric atmosphere at 800° C. for 1 hour, thereby removing the moisture or organic materials attached to the ζ aluminum oxide particles or the aluminum oxide particles absorbed. By measuring a mass of the aluminum oxide particles after baking and then dividing the mass of the aluminum oxide particles after baking by the mass of the aluminum oxide particles before baking, the purity of the aluminum oxide of the aluminum oxide particles was calculated according to the foregoing equation (5).

Example 1

A rare earth aluminate fluorescent material having an average particle diameter of 33 μm and having a composition represented by $(Y_{0.99}Ce_{0.01})_3(Al_{1.00}Ga_{0.01})_5O_{12}$ was used. This rare earth aluminate fluorescent material and aluminum oxide particles having an average particle diameter of 0.5 μm were weighed such that a blending proportion (% by mass) of the aluminum oxide particles relative to a total amount of the rare earth aluminate fluorescent material and the aluminum oxide particles is a value shown in Table 1 and mixed in a wet type ball mill, to prepare a mixed powder for molded body. After the balls used for a mixing medium were removed from the mixed powder, the mixed powder was filled in a die, and a cylindrical molded body having a diameter of 65 mm and a thickness of 15 mm was formed at a pressure of 10 MPa (102 kgf/cm²). The obtained molded body was put in a packing container and vacuum packaged, followed by undergoing a CIP treatment at 176 MPa by using a cold hydro-isostatic pressing apparatus (manufactured by Kobe Steel Ltd.). The resulting molded body was held and calcined in a calcining furnace (manufactured by Marusho Denki Co., Ltd.) in an atmospheric atmosphere (oxygen concentration: about 20% by volume) at a temperature of 1,700° C. for 6 hours, thereby obtaining a ceramic complex. The obtained ceramic complex was cut in a plate thickness of 230 μm by using a wire saw, and the surface of the resulting sample was ground into a plate thickness of 110 μm by using a surface grinder, thereby obtaining a sample of a ceramic complex to be used as a wavelength conversion member. In each of the Examples and Comparative Examples, in the case of defining a total amount of the rare earth aluminate fluorescent material and the aluminum oxide particles as 100% by mass, the mass proportions of the rare earth aluminate fluorescent material and the aluminum oxide in the ceramic complex are identical with the blending proportions of the rare earth aluminate fluorescent material and the aluminum oxide particles in the mixed powder.

Example 2

A ceramic complex was obtained in the same manner as in Example 1, except that a rare earth aluminate fluorescent material having an average particle diameter of 27 μm and having a composition represented by $(Y_{0.99}Ce_{0.01})_3(Al_{0.99}Ga_{0.01})_5O_{12}$ was used, and a sample of a ceramic complex having the same size and plate thickness as in Example 1 was then obtained.

Example 3

A ceramic complex was obtained in the same manner as in Example 1, except that a rare earth aluminate fluorescent material having an average particle diameter of 22 μm and having a composition represented by $(Y_{0.99}Ce_{0.01})_3(Al_{0.98}Ga_{0.01})_5O_{12}$ was used, and the calcining temperature was changed to 1,600° C., and a sample of a ceramic complex having the same size and plate thickness as in Example 1 was then obtained.

Example 4

A ceramic complex was obtained in the same manner as in Example 3, except that the calcining temperature was changed to 1,650° C., and a sample of a ceramic complex having the same size and plate thickness as in Example 3 was then obtained.

Example 5

A ceramic complex was obtained in the same manner as in Example 3, except the calcining temperature was changed to 1,700° C., and a sample of a ceramic complex having the same size and plate thickness as in Example 3 was then obtained.

Example 6

A ceramic complex was obtained in the same manner as in Example 1, except that a rare earth aluminate fluorescent material having an average particle diameter of 22 μm and having a composition represented by $(Y_{0.99}Ce_{0.01})_3(Al_{0.98}Ga_{0.01})_5O_{12}$ and aluminum oxide particles having an average particle diameter of 1.1 μm were used, and a blending proportion (% by mass) of the aluminum oxide particles to the total amount of the rare earth aluminate fluorescent material and the aluminum oxide particles was regulated to a value shown in Table 1, and a sample of a ceramic complex having the same size and plate thickness as in Example 1 was then obtained.

Example 7

A ceramic complex was obtained in the same manner as in Example 6, except that aluminum oxide particles having an average particle diameter of 0.5 μm were used, and a sample of a ceramic complex having the same size and plate thickness as in Example 6 was then obtained.

Example 8

A ceramic complex was obtained in the same manner as in Example 7. The obtained ceramic complex was subjected to secondary calcining by means of the HIP treatment by using an HIP apparatus (manufactured by Kobe Steel Ltd.) in an inert atmosphere containing a nitrogen gas (nitrogen concentration: 99% by volume or more) in a pressure medium at 1,750° C. and 196 MPa for 2 hours, to obtain an HIP-treated ceramic complex. This HIP-treated ceramic complex was cut to obtain a sample of a ceramic complex having the same size and plate thickness as in Example 7.

Example 9

A ceramic complex was obtained in the same manner as in Example 3, except that the calcining temperature was changed to 1,450° C., and this ceramic complex was cut to obtain a sample of a ceramic complex having the same size and plate thickness as in Example 3.

Example 10

A ceramic complex was obtained in the same manner as in Example 5, and a sample having the same size as in Example 5 was then obtained. Thereafter, a first principal surface serving as an incident surface of light of this sample and a second principal surface serving as an outgoing surface were subjected to roughening grinding with a grindstone having a low roughness by using a surface grinder, thereby obtaining a sample of a ceramic complex having a plate thickness of 110 μm.

Example 11

A ceramic complex was obtained in the same manner as in Example 5, and a sample having the same size as in Example 5 was then obtained. Thereafter, a second principal surface serving as an outgoing surface of light of this sample were subjected to roughening grinding with a grindstone having a low roughness by using a surface grinder, thereby obtaining a sample of a ceramic complex having a plate thickness of 110 μm.

Comparative Example 1

A ceramic complex was obtained in the same manner as in Example 1, except that a rare earth aluminate fluorescent material having an average particle diameter of 5 μm and having a composition represented by $(Y_{0.99}Ce_{0.01})_3Al_5O_{12}$ was used. The obtained ceramic complex was subjected to the HIP treatment by using an HIP apparatus (manufactured by Kobe Steel Ltd.) in an inert atmosphere containing a nitrogen gas (nitrogen concentration: 99% by volume or more) as a pressure medium at 1,750° C. and 196 MPa for 2 hours, and this HIP-treated ceramic complex was cut and ground to obtain a sample of a ceramic complex having the same size and plate thickness as in Example 1.

Comparative Example 2

A ceramic complex was obtained in the same manner as in Example 1, except that a rare earth aluminate fluorescent material having an average particle diameter of 22 μm and having a composition represented by $(Y_{0.99}Ce_{0.01})_3(Al_{0.98}Ga_{0.01})_5O_{12}$ was used. The obtained ceramic complex was subjected to the HIP treatment in the same manner as in Comparative Example 1, and the HIP-treated ceramic complex was cut and ground to obtain a sample of a ceramic complex having the same size and plate thickness as in Example 1.

Comparative Example 3

A ceramic complex was obtained in the same manner as in Example 1, except that a rare earth aluminate fluorescent material having an average particle diameter of 22 μm and having a composition represented by $(Y_{0.99}Ce_{0.01})_3(Al_{0.98}Ga_{0.01})_5O_{12}$ was used. The obtained ceramic complex was subjected to the HIP treatment in the same manner as in Comparative Example 1, and the HIP-treated ceramic complex was cut and ground to obtain a sample of a ceramic complex having the same size as in Example 1 and a plate thickness of 200 μm.

Relative Density (%) of Ceramic Complex

A relative density of the ceramic complex of each of the Examples and Comparative Examples was measured. The results are shown in Table 1. The relative density of the ceramic complex of each of the Examples and Comparative Examples was calculated according to the foregoing equation (1).

A true density of the ceramic complex was calculated according to the foregoing equation (2). The calculation was performed by defining the true density of the aluminum oxide particles used in each of the Examples and Comparative Examples as 3.98 g/cm³ and the true density of the rare earth aluminate florescent material as 4.60 g/cm³, respectively.

An apparent density of the ceramic complex was calculated according to the foregoing equation (3).

Void Fraction (%) of Ceramic Complex

The true density of the ceramic complex of each of the Examples and Comparative Examples was defined as 100%, and a value obtained by subtracting the relative density of each ceramic complex from the true density of each ceramic complex was defined as a void fraction (%). Specifically, the void fraction of the ceramic complex was calculated according to the foregoing equation (4).

Luminous Efficiency

To the sample of the ceramic complex of each of the Examples and Comparative Examples, laser light having a wavelength of 455 nm was emitted from a laser diode and allowed to enter the sample such that the light diameter of the incident light was 3.5 mm, and the radiant flux of the light emitted from the sample was measured with an integral sphere. The radiant flux of Comparative Example 2 was defined as 100%, and a relative radiant flux of the radiant flux measured for the sample of the ceramic complex of each of the Examples and Comparative Examples relative to the radiant flux of Comparative Example 2 was defined as a luminous efficient (%). The results are shown in Table 1.

Light Diameter Ratio [(Light Diameter of Outgoing Light)/(Light Diameter of Incident Light)]

Figure 2:
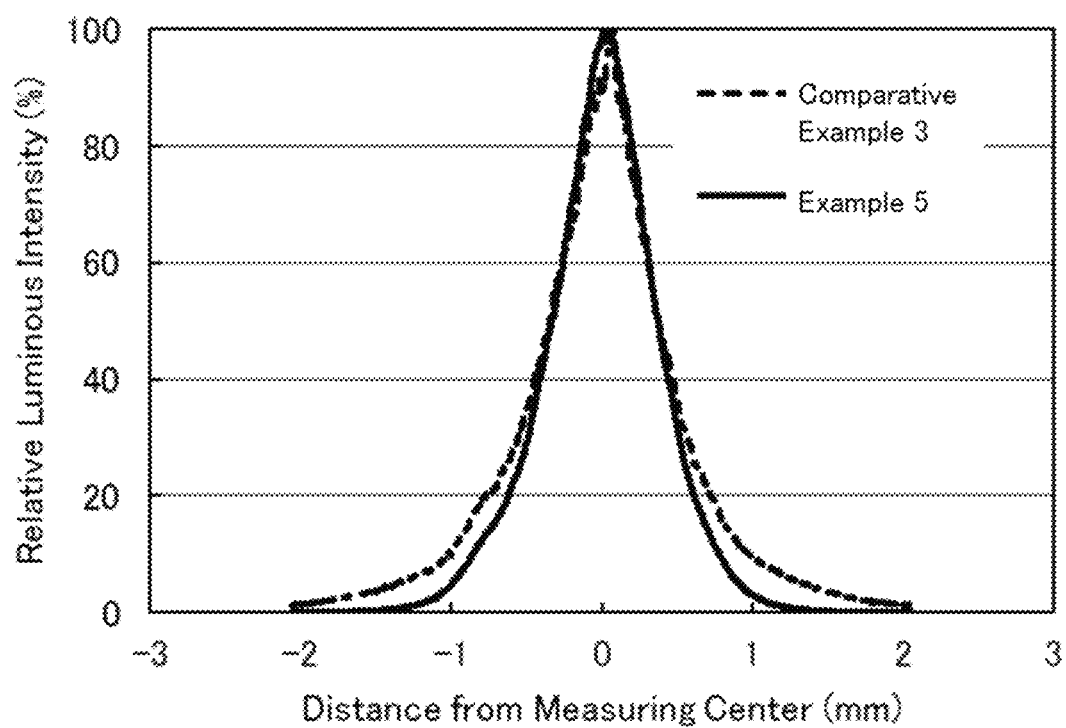
FIG. 2 is a light emission spectrum showing a relation of a relative luminous intensity with respect to a maximum luminance and a distance from a measuring center, when the maximum luminance of each sample measured using an LD chip composed of a nitride semiconductor having a peak light emission wavelength of 455 nm from each of a ceramic complex according to Example 5 and a ceramic complex according to Comparative Example 3 is defined as 100.

To the sample of the ceramic complex of each of the Examples and Comparative Examples, laser light having a wavelength of 455 nm was emitted from a laser diode and allowed to enter the sample such that the light diameter of the incident light was 3.5 mm, and the light diameter of the laser light was defined as the light diameter of the incident light to be allowed to enter the first principal surface of the sample. As for the light diameter of the outgoing light emitted from the second principal surface of the ceramic complex, the light emission luminance of the light emitted from the sample of the ceramic complex of each of Examples and Comparative Examples was measured with a color and luminance meter; the position exhibiting a maximum luminance in the obtained light emission spectrum was used as a center (measuring center), and distances (mm) of two positions where a luminance became one-hundredth of the maximum luminance in the light emission spectrum (one-hundredth luminance) from the measuring center were each measured as an absolute value; and the sum of the absolute values of the distances (mm) of the two positions where the luminance became one-hundredth of the maximum luminance in the light emission spectrum from the measuring center was measured as the light diameter of the outgoing light emitted from the second principal surface. The light diameter ratio of the light diameter of the outgoing light emitted from the second principal surface to the incident light to be allowed to enter the first principal surface was determined. The results are shown in Table 1 and FIG. 2.

Arithmetic Average Roughness (Sa) of Surface and Arithmetic Average Roughness (Ra) of Line The arithmetic average roughness Sa of the surface on each of the second principal surface and the first principal surface of the sample of the ceramic complex of each of Examples 5, 10, and 11, and the arithmetic average roughness Ra of the line on each of the second principal surface and the first principal surface of the above-described respective sample were measured. The arithmetic average roughness Sa of the surface was measured by a roughness shape measuring instrument (a product name: VS1550, manufactured by Hitachi, Ltd.) in conformity with ISO 25178. The arithmetic average roughness Ra of the line was measured by a roughness shape measuring instrument (a product name: SJ-210, manufactured by Mitutoyo Corporation) in conformity with ISO 1997.

SEM Photograph

Figure 3:
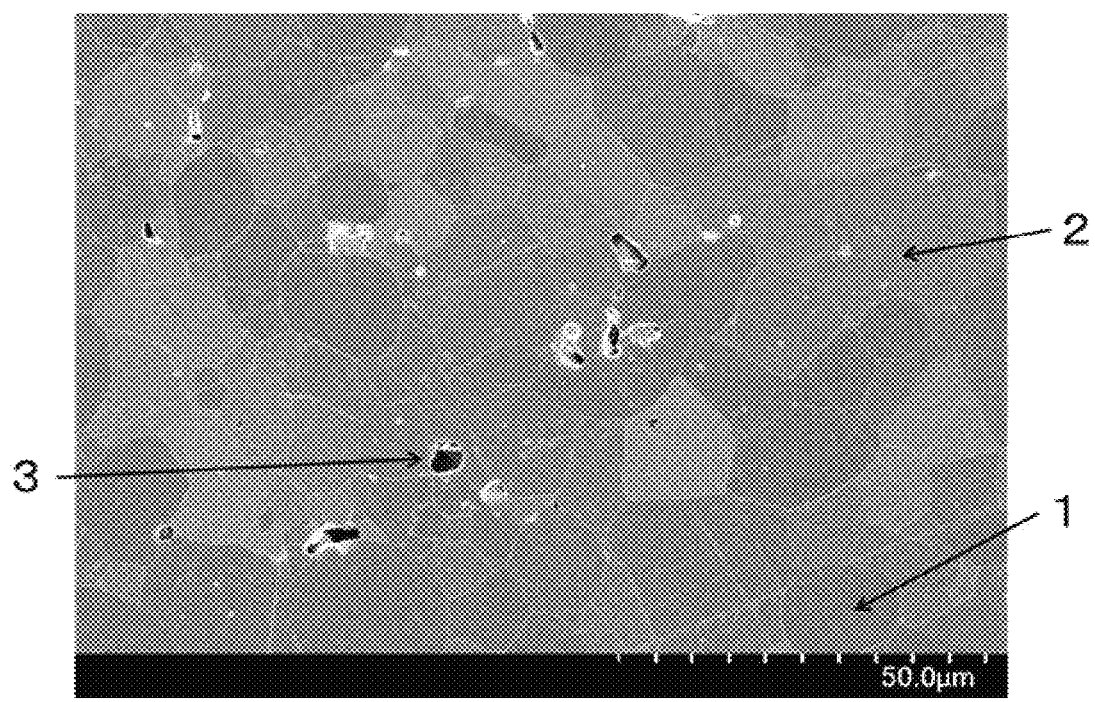
FIG. 3 is a cross-sectional SEM micrograph of the ceramic complex according to Example 5.
Figure 4:
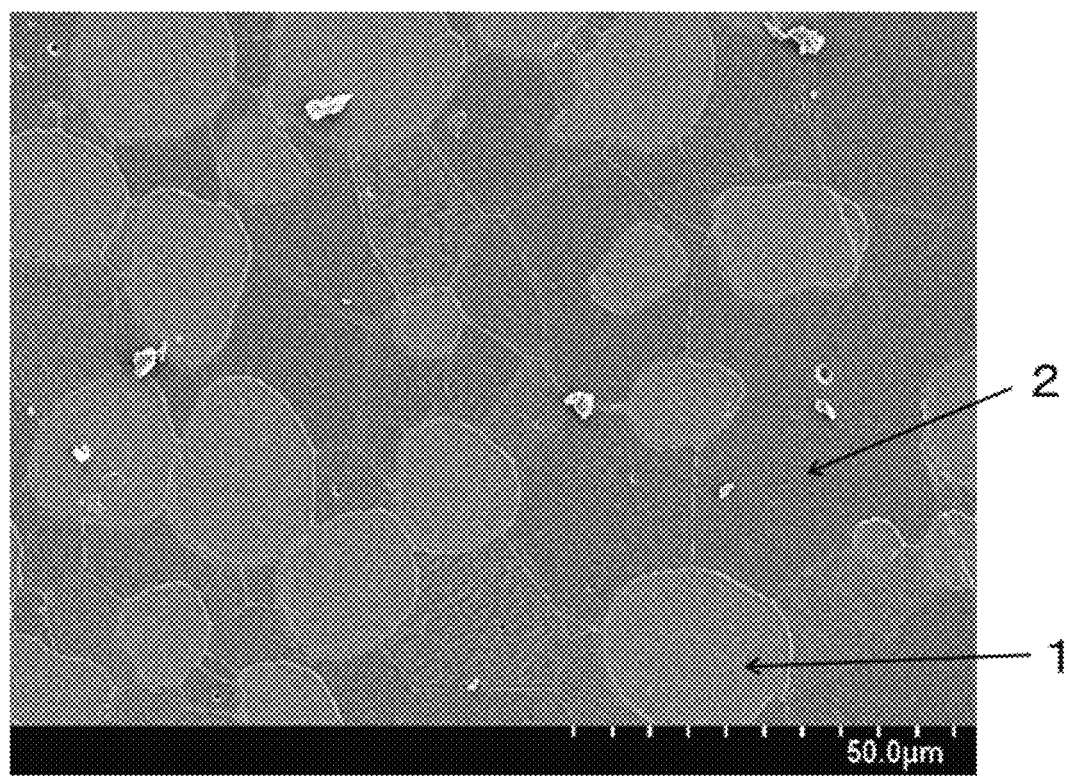
FIG. 4 is a cross-sectional SEM micrograph of a ceramic complex according to Comparative Example 2.

An SEM photograph of a cross section of each of the ceramic complex of Example 5 and the ceramic complex of Comparative Example 2 was obtained with a scanning electron microscope (SEM). FIG. 3 is a cross-sectional SEM photograph of the ceramic complex of Example 5. FIG. 4 is a cross-sectional SEM photograph of the ceramic complex of Comparative Example 2.

TABLE 1

| | Aluminum oxide particles | | | Wavelength conversion member | | | | |
| --- | --- | --- | --- | --- | --- | --- | --- | --- |
| | Average particle diameter (μm) | Purity (%) | Blending proportion (% by mass) | Calcining temperature (° C.) | HIP treatment temperature (° C.) | Plate thickness (μm) | Relative density (%) | Void fraction (%) |
| Example 1 | 0.5 | 99.9 | 70 | 1700 | — | 110 | 96.4 | 3.6 |
| Example 2 | 0.5 | 99.9 | 70 | 1700 | — | 110 | 96.9 | 3.1 |
| Example 3 | 0.5 | 99.9 | 70 | 1600 | — | 110 | 96.2 | 3.8 |
| Example 4 | 0.5 | 99.9 | 70 | 1650 | — | 110 | 96.7 | 3.3 |
| Example 5 | 0.5 | 99.9 | 70 | 1700 | — | 110 | 96.9 | 3.1 |
| Example 6 | 1.1 | 99.9 | 60 | 1700 | — | 110 | 95.1 | 4.9 |
| Example 7 | 0.5 | 99.9 | 60 | 1700 | — | 110 | 93.3 | 6.7 |
| Example 8 | 0.5 | 99.9 | 60 | 1700 | 1750 | 110 | 94.6 | 5.4 |
| Example 9 | 0.5 | 99.9 | 70 | 1450 | — | 110 | 93.9 | 6.9 |
| Example 10 | 0.5 | 99.9 | 70 | 1700 | — | 110 | 96.9 | 3.1 |
| Example 11 | 0.5 | 99.9 | 70 | 1700 | — | 110 | 96.9 | 3.1 |
| Comparative Example 1 | 0.5 | 99.9 | 70 | 1700 | 1750 | 110 | 99.8 | 0.2 |
| Comparative Example 2 | 0.5 | 99.9 | 70 | 1700 | 1750 | 110 | 99.8 | 0.2 |
| Comparative Example 3 | 0.5 | 99.9 | 70 | 1700 | 1750 | 200 | 99.8 | 0.1 |

| | Wavelength conversion member | | | | | |
| --- | --- | --- | --- | --- | --- | --- |
| | | Arithmetic average roughness Sa of surface (μm) | | Arithmetic average roughness Ra of line (μm) | | |
| | Luminous efficiency (%) | Second principal surface | First principal surface | Second principal surface | First principal surface | Light diameter ratio [(outgoing light)/(incident light)] |
| Example 1 | 136.1 | — | — | — | — | 0.73 |
| Example 2 | 133.3 | — | — | — | — | 0.71 |
| Example 3 | 154.1 | — | — | — | — | 0.68 |
| Example 4 | 149.7 | — | — | — | — | 0.68 |
| Example 5 | 140.2 | 0.02 | 0.01 | 0.07 | 0.05 | 0.71 |
| Example 6 | 141.8 | — | — | — | — | 0.72 |
| Example 7 | 152.7 | — | — | — | — | 0.65 |
| Example 8 | 157.7 | — | — | — | — | 0.70 |
| Example 9 | 161.8 | — | — | — | — | 0.60 |
| Example 10 | 147.0 | 0.90 | 0.87 | 1.03 | 1.03 | 0.69 |
| Example 11 | 148.2 | 0.91 | 0.02 | 1.02 | 0.05 | 0.70 |
| Comparative Example 1 | 90.1 | — | — | — | — | 0.94 |
| Comparative Example 2 | 100.0 | — | — | — | — | 0.97 |
| Comparative Example 3 | 72.8 | — | — | — | — | >1.10 |

As shown in Table 1, in the ceramic complexes according to Examples 1 to 11, since the void fraction is in a range of 1% or more and 10% or less, the proportion in which the incident light transmitted therethrough without being subjected to wavelength conversion was small, and the luminous efficiency could be enhanced as compared with that in the ceramic complexes of Comparative Examples 1 to 3. In the ceramic complexes according to Examples 7 to 9, the void fraction is 5% or more, so that it may be considered that the light could be diffusedly reflected by voids to scatter the light, and the luminous efficiency became higher. In addition, in the ceramic complexes according to Examples 1 to 11, the ratio of the light diameter of the outgoing light emitted from the second principal surface to the light diameter of the incident light allowed to enter the first principal surface [light diameter ratio (outgoing light)/(incident light)] was in a range of 0.4 or more and 0.9 or less. From the light diameter ratios of the ceramic complexes according to Examples 1 to 11, it could be confirmed that in the ceramic complexes according to Examples 1 to 11, the diffusion of the outgoing light is suppressed, and the outgoing light can be condensed into a desired position.

In addition, as shown in Table 1, in the ceramic complexes according to Examples 10 and 11, the arithmetic average roughness Sa of the surface on the second principal surface serving as the outgoing surface of light is in a range of 0.05 µm or more and 15 µm or less, and the arithmetic average roughness Ra of the line is 0.1 µm or more and 20 µm or less. In the ceramic complexes of Examples 10 and 11, the luminous efficiency is high, and the light diameter ratio is small as compared with the ceramic complex of Example 5, and therefore, it could be confirmed that light of a straight pathway which is closer to the vertical direction relative to the outgoing surface can be emitted, and the outgoing light can be condensed into a desired position. In the ceramic complex of Example 5, the arithmetic average roughness Sa of the surface on the second principal surface is less than 0.05 µm, and the arithmetic average roughness Ra of the line is less than 0.1 µm, and hence, the second principal surface is in a flatter state.

As shown in Table 1, in the ceramic complexes according to Comparative Examples 1 to 3, since the void fraction is less than 1%, the voids are few, and the light cannot be scattered by diffusedly reflecting the incident light by the voids, so that the luminous efficiency was worsened. In addition, in the ceramic complexes according to Comparative Examples 1 to 3, the light diameter ratio [(outgoing light)/(incident light)] is more than 0.9, so that the diffusion of the light emitted from the ceramic complex could not be suppressed. In particular, in the ceramic complex according to Comparative Example 3 having a plate thickness of 200 µm, the luminous efficiency was worsened as compared with Comparative Example 2, and the light diameter ratio [(outgoing light)/(incident light)] became large as more than 1.10, so that the diffusion of the outgoing light could not be suppressed.

As shown in the SEM photograph of FIG. 3, in the ceramic complex of Example 5, in an aluminum oxide 2 in which the surfaces of aluminum oxide particles constituting a matrix of the ceramic complex are fused, a rare earth aluminate fluorescent material 1 discriminated from the matrix of the aluminum oxide by the grain boundary existed, and the aluminum oxide 2 constituting the matrix and the rare earth aluminate fluorescent material 1 were integrated with each other, to form the ceramic complex. In the ceramic complex, the surfaces of the aluminum oxide particles were fused in a state where the crystal grain boundaries of the aluminum oxide particles having a smaller average particle diameter than the rate earth aluminate fluorescent material remained, to constitute the matrix of the ceramic complex. In the ceramic complex of Example 5, voids 3 that are a space where the aluminum oxide and the rare earth aluminate fluorescent material do not exist were contained. As shown in FIG. 3, a maximum pore diameter of the voids 3 contained in the ceramic complex of Example 5 was in a range of 1 µm or more and 15 µm or less, and more specifically, the maximum pore diameter was in a range of 1 µm or more and 10 µm or less.

As shown in the SEM photograph of FIG. 4, in the ceramic complex of Comparative Example 2, in a dense aluminum oxide 2 in which the surfaces of aluminum oxide particles constituting a dense matrix were fused, a rare earth aluminate fluorescent material 1 discriminated from the matrix of the aluminum oxide 2 by the grain boundary existed. In the ceramic complex of Comparative Example 2, the voids did not substantially exist.

The ceramic complex according to an embodiment of the present invention can be utilized for on-board, illumination device for ordinary lighting, backlight of liquid crystal display device, and projector through a combination with an LED or LD light emitting element.

The invention claimed is:

1. A ceramic complex comprising a rare earth aluminate fluorescent material having an average particle diameter of 15 µm or more and 40 µm or less, aluminum oxide having a purity of aluminum oxide of 99.0% by mass or more, and voids, wherein the content of the rare earth aluminate fluorescent material is in a range of 15% by mass or more and 50% by mass or less relative to a total amount of the rare earth aluminate fluorescent material and the aluminum oxide, and a void fraction is in a range of 1% or more and 10% or less,
wherein the ceramic complex has a first principal surface serving as an incident surface of light and a second principal surface serving as an outgoing surface of light, which is positioned on the opposite side to the first principal surface, and a plate thickness of a plate-like body is in a range of 90 µm or more and 250 µm or less.

2. The ceramic complex according to claim 1, wherein an arithmetic average roughness Sa of the surface on the second principal surface is in a range of 0.05 µm or more and 15 µm or less.

3. The ceramic complex according to claim 1, wherein an arithmetic average roughness Ra of a line on the second principal surface is in a range of 0.1 µm or more and 20 µm or less.

4. The ceramic complex according to claim 1, wherein the rare earth aluminate fluorescent material has a composition represented by the following formula (I):

$$(Ln_{1-a}Ce_a)_3(Al_cGa_b)_5O_{12} \tag{I}$$

wherein in the formula (I), Ln is at least one rare earth element selected from the group consisting of Y, Gd, Lu, and Tb; and a, b, and c each satisfy $0<a\leq0.022$, $0\leq b\leq0.4$, $0<c\leq1.1$, and $0.9\leq(b+c)\leq1.1$.

5. The ceramic complex according to claim 1, wherein a ratio of a light diameter of an outgoing light emitted from the second principal surface to a light diameter of an incident light to be allowed to enter the first principal surface is in a range of 0.4 or more and 0.9 or less.

6. The ceramic complex according to claim 1, wherein a maximum pore diameter of the voids is 1 µm or more and 15 µm or less.

7. A projector comprising the ceramic complex according to claim 1 and a light source.

8. The projector according to claim 7, wherein the light source is a semiconductor laser.

9. A method for producing a ceramic complex, comprising preparing a molded body containing a rare earth aluminate fluorescent material having an average particle diameter in a range of 15 μm or more and 40 μm or less and aluminum oxide particles having an average particle diameter in a range of 0.2 μm or more and 1.7 μm or less and a purity of aluminum oxide of 99.0% by mass or more; and calcining the molded body in an oxygen containing atmosphere to obtain a ceramic complex having a void fraction in a range of 1% or more and 10% or less.

10. The method for producing a ceramic complex according to claim 9, wherein a temperature of the calcining is in a range of 1,400° C. or higher and 1,800° C. or lower.

11. The method for producing a ceramic complex according to claim 9, wherein the ceramic complex is further subjected to an annealing treatment in a reducing atmosphere to obtain an annealing treated material.

12. The method for producing a ceramic complex according to claim 11, wherein a temperature of the annealing treatment is a temperature lower than the temperature of the calcining and is in a range of 1,000° C. or higher and 1,600° C. or lower.

13. The method for producing a ceramic complex according to claim 9, wherein the content of the rare earth aluminate fluorescent material in the molded body is 15% by mass or more and 50% by mass or less relative to a total amount of the rare earth aluminate fluorescent material and the aluminum oxide particles.

14. The method for producing a ceramic complex according to claim 9, wherein the rare earth aluminate fluorescent material has a composition represented by the following formula (I):

$$(Ln_{1-a}Ce_a)_3(Al_cGa_b)_5O_{12} \qquad (I)$$

wherein in the formula (I), Ln is at least one rare earth element selected from the group consisting of Y, Gd, Lu, and Tb; and a, b, and c each satisfy $0<a\leq0.022$, $0\leq b\leq0.4$, $0<c\leq1.1$, and $0.9\leq(b+c)\leq1.1$.

* * * * *